(12) United States Patent
Cardwell

(10) Patent No.: US 6,784,540 B2
(45) Date of Patent: Aug. 31, 2004

(54) SEMICONDUCTOR DEVICE PACKAGE WITH IMPROVED COOLING

(75) Inventor: Charles S. Cardwell, Hassocks (GB)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 10/267,142

(22) Filed: Oct. 8, 2002

(65) Prior Publication Data

US 2003/0067071 A1 Apr. 10, 2003

Related U.S. Application Data

(60) Provisional application No. 60/328,362, filed on Oct. 10, 2001.

(51) Int. Cl.$^7$ .................. H01L 23/24; H01L 23/14; H01L 23/10
(52) U.S. Cl. .............. 257/722; 257/702; 257/703; 257/705; 257/706; 257/713
(58) Field of Search ............... 257/722, 700, 257/703, 705, 706, 713, 702

(56) References Cited

U.S. PATENT DOCUMENTS

| | | | |
|---|---|---|---|
| 4,092,697 A | * | 5/1978 | Spaight .................. 257/722 |
| 4,415,025 A | * | 11/1983 | Horvath ................. 257/722 |
| 4,914,551 A | * | 4/1990 | Anschel et al. ......... 361/389 |
| 5,057,909 A | * | 10/1991 | Mok et al. .............. 257/722 |
| 5,184,211 A | * | 2/1993 | Fox ...................... 257/706 |
| 5,368,094 A | * | 11/1994 | Hung et al. ............. 361/695 |
| 5,404,273 A | * | 4/1995 | Akagawa ............... 361/707 |
| 5,710,459 A | * | 1/1998 | Teng et al. .............. 257/717 |
| 6,071,757 A | * | 6/2000 | Fogal et al. ............. 438/110 |
| 6,093,961 A | * | 7/2000 | McCullough ........... 257/718 |
| 6,212,074 B1 | | 4/2001 | Gonsalves et al. |
| 6,219,243 B1 | | 4/2001 | Ma et al. |
| 6,550,531 B1 | * | 4/2003 | Searls et al. ............ 361/700 |
| 2003/0113954 A1 | * | 6/2003 | Glenn et al. ............ 438/124 |

FOREIGN PATENT DOCUMENTS

| | | | | |
|---|---|---|---|---|
| JP | 5-41471 | * | 2/1994 | ............ 257/722 |
| JP | 62-73651 | * | 4/1997 | ............ 257/722 |

OTHER PUBLICATIONS

International Search Report dated Jan. 13, 2003.

* cited by examiner

*Primary Examiner*—Jasmine Clark
(74) *Attorney, Agent, or Firm*—Ostrolenk, Faber, Gerb & Soffen, LLP

(57) ABSTRACT

A chip scale package has a semiconductor MOSFET die which has a top electrode surface covered with a layer of a photosensitive liquid epoxy which is photolithographically patterned to expose portions of the electrode surface and to act as a passivation layer and as a solder mask. A solderable contact layer is then formed over the passivation layer. The individual die are mounted drain side down in a metal clip or can with the drain electrode disposed coplanar with a flange extending from the can bottom. The metal clip or drain clip has a plurality, a parallel spaced fins extending from its outwardly facing surface.

19 Claims, 11 Drawing Sheets

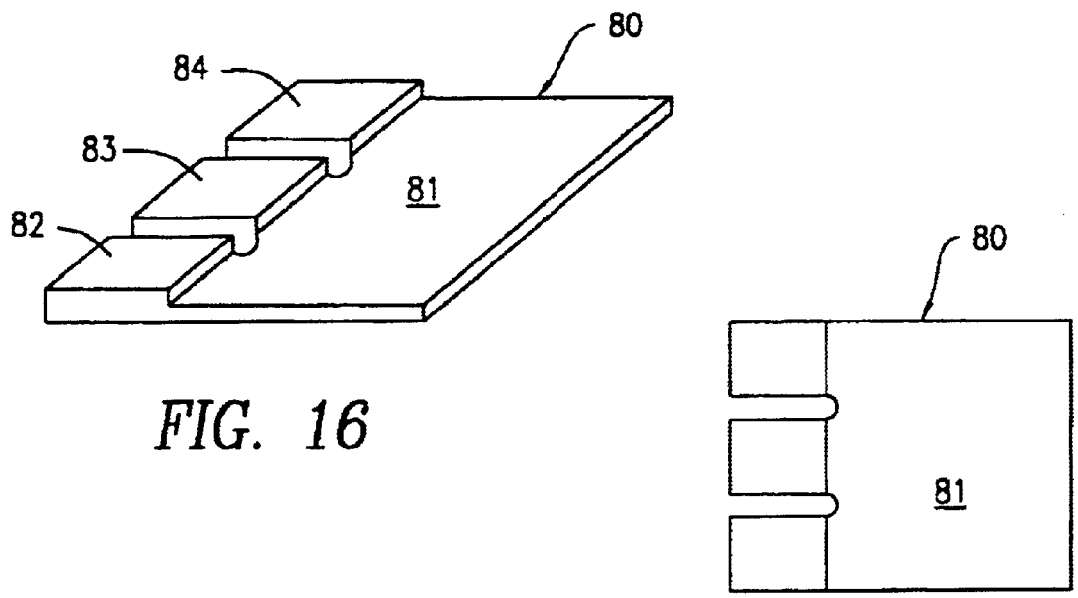
FIG. 16
FIG. 17
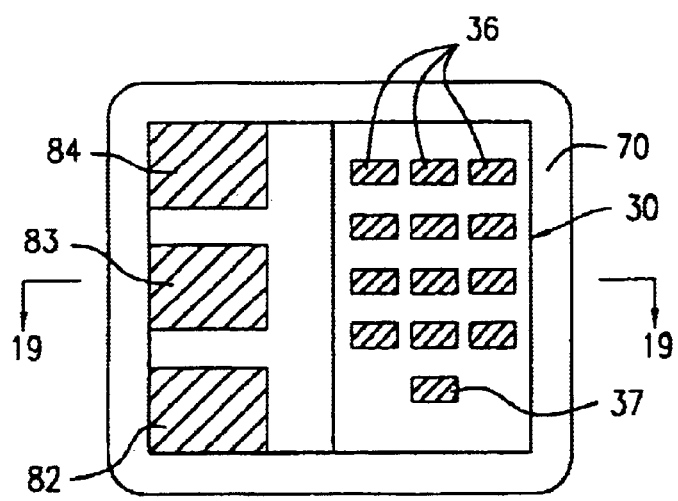
FIG. 18
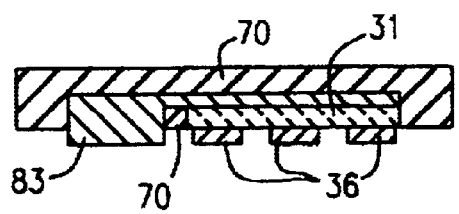
FIG. 19

SEMICONDUCTOR DEVICE PACKAGE WITH IMPROVED COOLING

RELATED APPLICATION

This application claims the benefit and priority of U.S. Provisional Application No. 60/328,362 filed Oct. 10, 2001 entitled SEMICONDUCTOR DEVICE PACKAGE WITH IMPROVED COOLING and which is incorporated herein by reference.

FIELD OF THE INVENTION

This invention relates to semiconductor device packages and more specifically relates to a novel semiconductor device package with a finned heat sink for improved cooling.

BACKGROUND OF THE INVENTION

This invention relates to semiconductor devices and more specifically relates to a process for the low cost manufacture of a novel semiconductor device.

In prior art semiconductor devices, the housing area is frequently a large multiple of the area of the semiconductor die contained therein. Further, in many known semiconductor device, heat is taken out only from one side of the die, usually the bottom surface. In addition, the process for the manufacturing of prior art semiconductor devices is costly, specially when single device handling techniques are used.

In the presently known semiconductor die, particularly power MOSgated die, the top electrode (the source) is generally an aluminum contact containing about 1.0% silicon (hereafter an aluminum contact). The aluminum contact is used because it is well adapted to the wafer manufacturing process. However, it is difficult to form electrical connections to such aluminum contacts so a wire bond process is usually used in which a wire is ultrasonically bonded to the underlying aluminum contact. These wire-bond connections have a limited area and are thus a source of electrical resistance ($R_{DSON}$) and of heat generation during operation. However, the bottom drain contact of a conventional MOSgated die is frequently a trimetal which is easily solderable or otherwise electrically connectable to a wide area contact surface without wire bonding as shown, for example, in U.S. Pat. No. 5,451,544. Thus, heat is primarily removed from the silicon die at the back contact surface, even though most heat is generated at the junction in the top surface and at the wire bonds. It would be desirable to remove heat from such a bottom drain in an improved manner.

It is known that solderable top contacts can be made to the top surface of a die, as shown in U.S. Pat. No. 5,047,833. However, the packages used for such solderable top contact structures have had very large "footprints" in comparison to the die area.

It would be desirable to produce a semiconductor device and a process for its manufacture which would occupy a smaller area on a circuit and would exhibit a lower $R_{DSON}$ than the known semiconductor devices.

It would be further desirable to produce such devices in a process which permits batch handling with reduced equipment on the production line and lower costs.

Devices are known in which the source side of a MOSgated device wafer is covered with a passivation layer, preferably a photosensitive liquid epoxy, or a silicon nitride layer, or the like. To form the passivation layer, the wafer is coated by spinning, screening, or otherwise depositing the liquid epoxy onto the wafer surface. The material is then dried and the coated wafer is exposed using standard photolithographic and masking techniques to form openings in the passivation layer to produce a plurality of spaced exposed surface areas of the underlying source metal and a similar opening to expose the underlying gate electrode of each die on the wafer. Thus, the passivation layer acts as a conventional passivation layer, but further acts as a plating resist (if required) and as a solder mask, designating and shaping the solder areas. The openings in the novel passivation layer can be made through to a conventional underlying solderable top metal such as a titanium/tungsten/nickel/silver metal. Alternatively, if the underlying metal is the more conventional aluminum metal the exposed aluminum can be plated with nickel and gold flash or other series of metals, resulting in a solderable surface, using the passivation as a plating resist. The tops of the plated metal segments are easily solderable, or otherwise contacted with low resistance, as compared to the high resistance connection of the usual wire bond to an aluminum electrode.

The source contact areas may have various geometries and can even constitute a single large area region.

The wafer is then sawn or otherwise singulated into individual die. The individual die are then placed source-side down and a U-shaped, an L-shaped or a cup shaped, partially plated drain clip is connected to the solderable drain side of the die, using a conductive epoxy or solder, or the like to bond the drain clip to the bottom drain electrode of the die. The bottoms of the posts of the drain clip may be coplanar with the source-side surface (that is the tops of the contact projections) of the die, or the source-side surface may be offset inwardly with respect to the bottoms of the post to improve reliability. The outer surface of the die is then overmolded in a mold tray. A large number of die with such drain clips can be simultaneously molded in the mold tray.

The bonding material may be protected with a fillet of passivation material or by overmolding all, or a part of the assembly. The parts can be made in production by using a lead frame, a continuous strip, or by molding devices in a single block and singulating devices from that block.

After molding, the devices are tested and laser marked and are again sawn into individual devices.

Devices of this kind are shown in a copending application Ser. No. 09/819,774, filed Mar. 28, 2001 entitled CHIP SCALE SURFACE MOUNTED DEVICE AND PROCESS OF MANUFACTURE, the disclosure of which is incorporated herein by reference.

BRIEF DESCRIPTION OF THE INVENTION

In accordance with the invention the bottom of a die, that is, the upward facing drain or other power contact of a semiconductor die, is at least thermally connected to a conductive heat sink with a finned structure. Such a structure is particularly useful in applications which employ forced air cooling such as servers, in which the heat sink may be several millimeters thick; or in lap top or other applications, in which the heat sink may have a thickness of only ½ millimeter. The heat sink may be connected to the die as by a conductive solder, or a conductive adhesive such as a silver filled epoxy. The heat sink itself may be made of any suitable conductive material such as aluminum or metal-matrix polymer/epoxy and can be extruded, formed or molded.

BRIEF DESCRIPTION OF THE DRAWINGS

FIG. 16 is a perspective view of a further embodiment of a drain clip which can be modified by the invention.

FIG. 17 is a top view of the clip of FIG. 16.

FIG. 18 is a bottom view of assembly of the clip of FIGS. 16 and 17 with a die of the general kind of that of FIGS. 3 and 4 after overmolding.

FIG. 19 is a cross-section of FIG. 18 taken across section line 19—19 in FIG. 18.

DETAILED DESCRIPTION OF THE DRAWINGS

The present invention provides a novel package for semiconductor die of the kind having power or other electrodes on opposite surfaces of the die and makes it possible, with low cost manufacturing techniques, to make both electrodes available for surface mounting on a common support surface, for example the metallized pattern on a printed circuit board with improved cooling. While the invention is described with reference to a vertical conduction power MOSFET having the gate and source electrode on one surface and a drain electrode on the opposite surface, the invention is equally applicable to IGBTs, thyristors, diodes and the like of various topologies.

Thus, as will be seen, a novel die clip surrounds and contacts at least a portion of the back side electrode (a drain electrode in a MOSFET) and at least one post of the clip extends over an edge of the die and terminates in a plane which is coplanar with, but insulated from the front surface contacts (gate and source in a MOSFET) and the die clip acts as a good heat sink by virtue. The device may then be overmolded around the back and sides of the die and clip to present flat, coplanar solderable contact surfaces for all die electrodes to a mounting surface.

All top contact surfaces are formed, using a novel solder mask to form easily solderable contact surfaces on the die top surface, while the die are in the wafer stage. Drain clips are then attached to the die after die singulation and are overmolded in a batch molding process.

Figure 1:
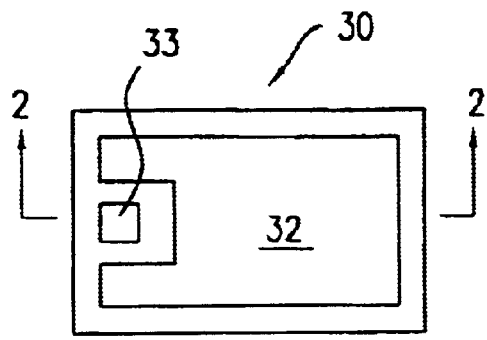
FIG. 1 is a top view of a singulated power MOSFET die which can be housed in accordance with the invention.
Figure 2:
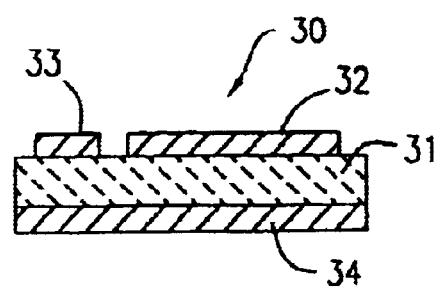
FIG. 2 is a cross-section of FIG. 1 taken across section line 2—2 in FIG. 1.

FIG. 1 shows a typical power MOSFET 30 to which the invention can apply. The die 30 may be of the type shown in U.S. Pat. No. 5,795,793 but can be any kind of die having a junction containing silicon body 31, a top aluminum (that is, aluminum with 1.0% silicon) source electrode 32, an aluminum gate electrode 33 and a bottom drain electrode 34 (FIG. 2), which may be a conventional easily solderable trimetal. The top aluminum layer may be any other suitable metallic material. Connections are normally made to aluminum electrodes 32 and 33 by wire bonding.

Figure 3:
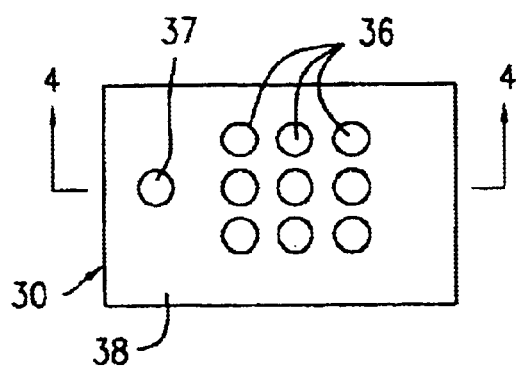
FIG. 3 is a top view of the die of FIG. 1 after it has been processed to define a plurality of separate "solderable" source contact areas and a "solderable" gate area.
Figure 4:
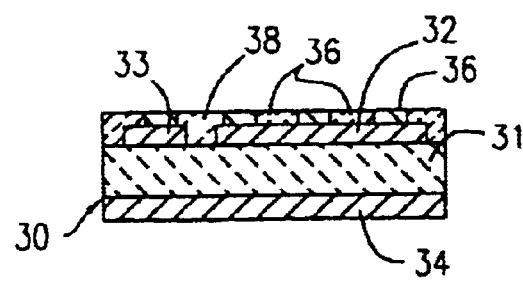
FIG. 4 is a cross-section of FIG. 3 taken across section line 4—4 in FIG. 3.

As will be later described, a plurality of easily solderable contact posts 36 are secured to (formed on) the source electrode 32 and a contact post 37 is secured to the gate electrode 33 as shown in FIGS. 3 and 4. Contacts 36 and 37 are sub-flush by the thickness of the passivation in the case of a silver top metal die, and by about one-half the passivation thickness in the case of a plated aluminum top metal die. The flat contact tops are coplanar. Contact to these contact surfaces is made by a solder paste, which at minimum printable solder thickness is about 4 to 5 times as thick as layer 38, which is the passivation layer residing on the top surface of the die.

Figure 5:
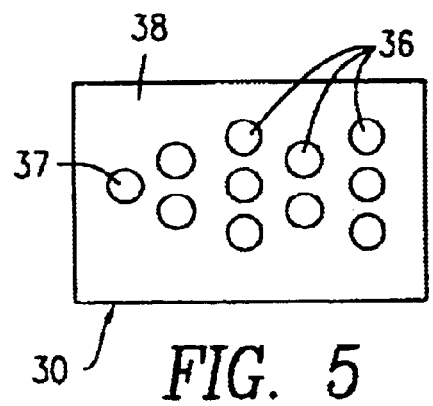
FIG. 5 is a view like that of FIG. 3 of a die with a modified source contact pattern.
Figure 6:
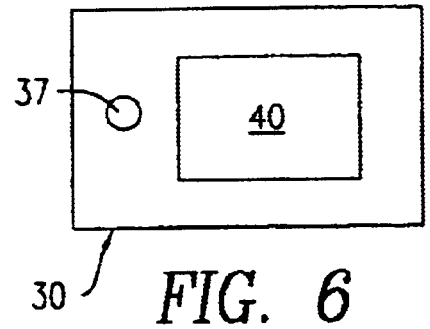
FIG. 6 is a view like that of FIGS. 3 and 5 of a still further and large area "solderable" source contact pattern.
Figure 11:
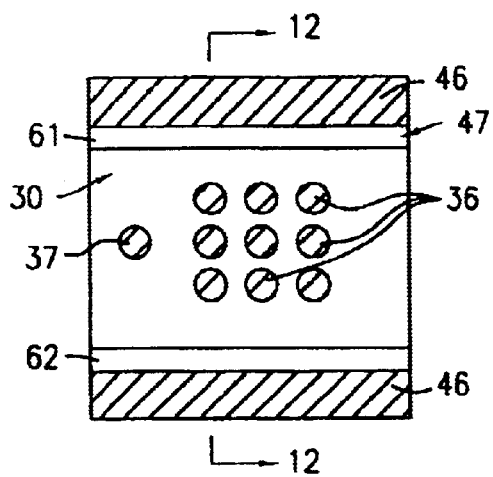
FIG. 11 is a bottom view of the subassembly of the die of FIGS. 3 and 4 and the clip of FIG. 9.

The pattern of contacts 36 can take different forms such as those shown in FIGS. 5, 11 and 18. Further, it is also possible to use a large area solderable contact such as source contacts 40, for the die of FIG. 6 and FIGS. 7 and 8. A metallizing process for forming contacts 36, 37 and 40 shall be later described.

Figure 7:
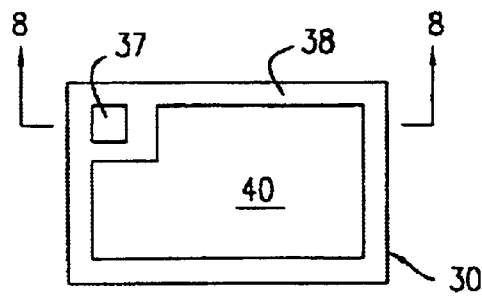
FIG. 7 is a top view of a still further contact topology (with a corner gate).
Figure 8:
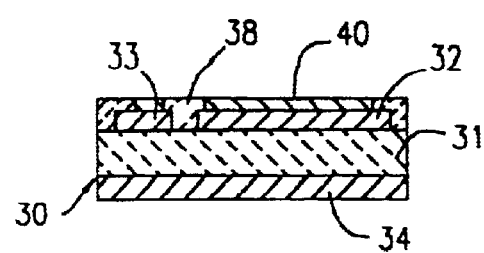
FIG. 8 is a cross-section of FIG. 7 taken across section lines 8—8 in FIG. 7.
Figure 9:
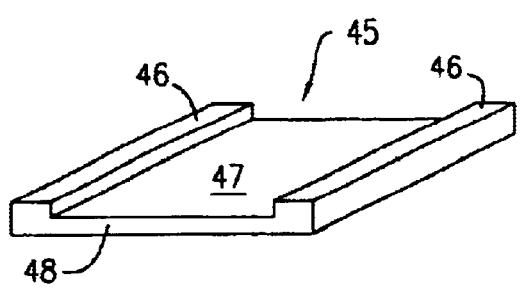
FIG. 9 is a perspective view of a drain clip which can be modified in accordance with the invention.

In forming the package with die prepared as shown in FIGS. 3 to 8, a conductive plated (or partly plated) metal clip 45 of FIG. 9 is employed. Clip 45 may be a copper alloy with at least partially plated silver surfaces where contact to other surfaces is to be made. As will be later described, clip 45 is modified with fins for improved cooling.

Clip 45 has a general "U-shape" with shallow posts 46 of a length slightly greater than the thickness of die 31 as measured from the surface 47 to the free surfaces of columns 36, 37, plus the thickness of an adhesive used to connect the drain to the plated interior surface 47 of the flat thin web 48 of the clip. For example, the clip may have a total thickness along the full length of posts 45 of 0.7 mm and a length from surface 47 to the free end of posts 46 of about 0.39 mm. The distance between the posts 46 depends on the size of the die, and a distance of 5.6 mm has been used for a size 4.6 die of International Rectifier Corporation, with a total width of about 1.5 mm for each of posts 46.

Figure 10:
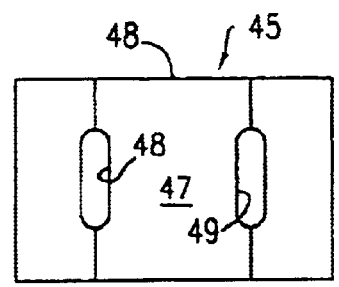
FIG. 10 is a top view of the drain clip of FIG. 9, with mold lock openings formed in the clip.

Mold lock openings 48 and 49 may also be formed in the clip 45 as shown in FIG. 10.

The solderable bottom drain electrode 34 of the die 30 is electrically connected to and secured to the plated interior of drain clip 45 as by a conductive adhesive 60 as shown in FIGS. 12, 29, 30 and 31. The adhesive can, for example, be a silver loaded epoxy material which is suitably cured. Gaps 61 and 62 are left between the side edges of die 30 and the opposite sides of posts 46 of clip 45.

In the embodiment shown, the structure is dimensioned so that the free surfaces of posts 46 (the drain connector) and posts 36 and 37 are coplanar. In a preferred embodiment, the source electrode of the die may be offset inwardly in relation to free surfaces of posts 46 in order to improve the reliability of the device.

Figure 12:
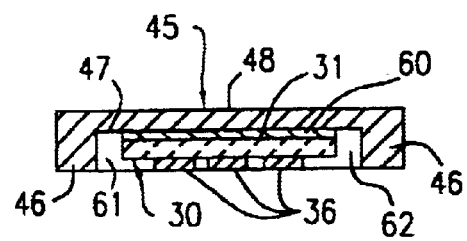
FIG. 12 is a cross-section of FIG. 11 taken across section line 12—12 in FIG. 11.
Figure 13:
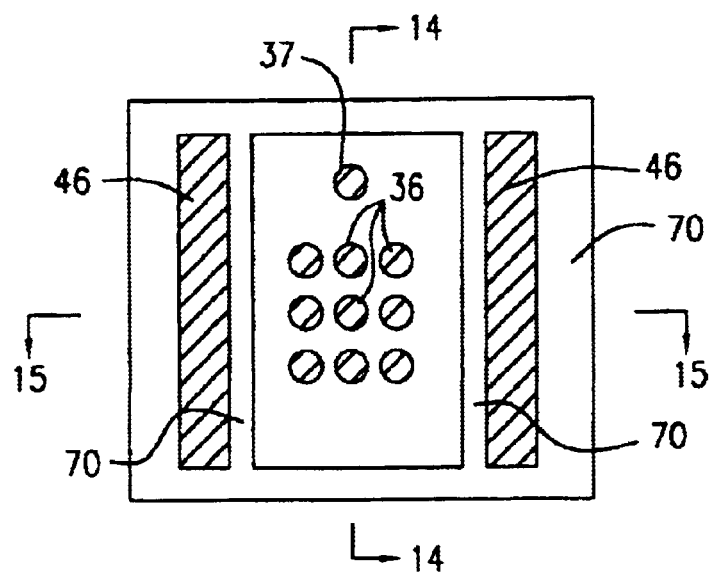
FIG. 13 shows the subassembly of FIGS. 11 and 12 after overmolding in a molding tray.
Figure 14:
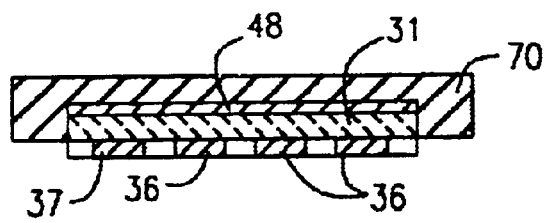
FIG. 14 is a cross-section of FIG. 13, taken across section lines 14—14 in FIG. 13.
Figure 15:
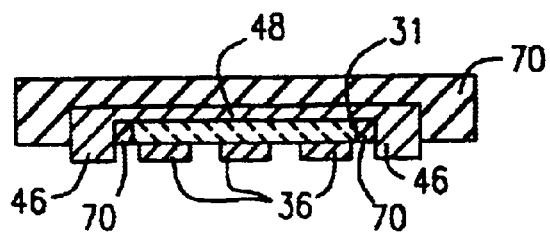
FIG. 15 is a cross-section of FIG. 13 taken across section line 15—15 in FIG. 13.

Thereafter and as shown in FIGS. 13, 14 and 15, the device of FIGS. 11 and 12 is overmolded with mold compound 70 in a mold tray. Mold compound 70 lies over the full exposed outer surface of clip 45, except for the outer free surfaces of posts 46. Mold compound fills into the gaps 61 and 62 as shown in FIGS. 13 and 15. The device is now ready for surface mounting to conductive traces on a printed circuit board, which are aligned with contacts 36, 37 and 46.

FIGS. 16 to 19 show a further embodiment of a device which can be modified by the invention, using a different clip geometry. Thus, the clip 80 of FIGS. 16 and 17 has a web 81 and three segmented projecting posts 82, 83 and 84. A die 30, which has projecting contacts 36 and 37 is first adhered, at its drain contact (not shown) to web 81 as shown in FIGS. 18 and 19 so that contacts 36, 37 and the free surfaces of drain clip projections 82, 83 and 84 lie in a common plane. The device is then overmolded with molded compound 70 in a suitable mold tray.

Figure 21:
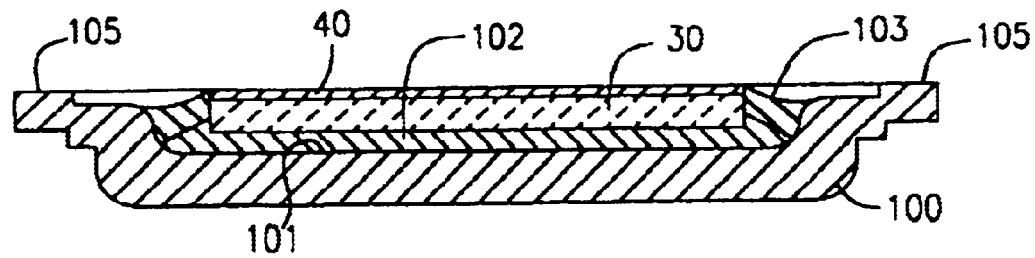
FIG. 21 is a cross-section of FIG. 20 taken across section lines 21—21 in FIG. 20.
Figure 20:
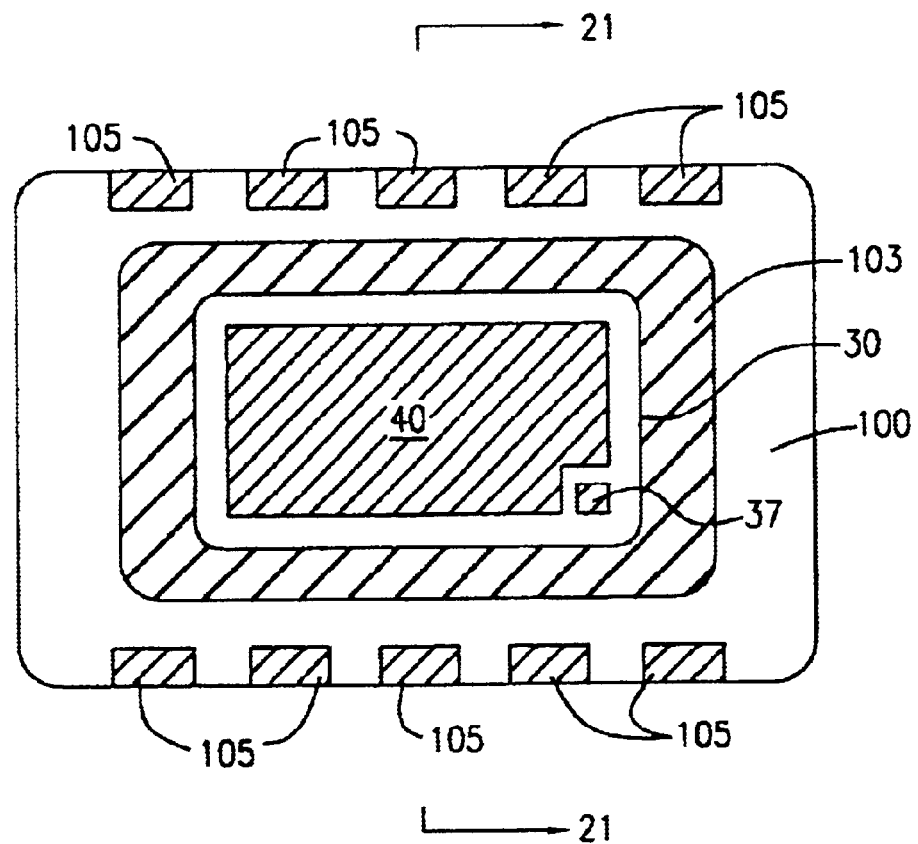
FIG. 20 is a bottom view of a cup shaped drain clip with a die of the topology of FIGS. 7 and 8.

FIGS. 20 and 21 show a still further embodiment of a package that may be modified according to the present invention in which the die of FIGS. 7 and 8 is mounted in a cup-shaped clip 100 which is a silver plated copper alloy. Clip 100 has an internal area greater in length and width than the die 30, and, the bottom drain electrode of die 30 is connected to the interior web surface 101 (FIG. 21) by silver loaded (conductive) epoxy 102, which is cured. Optimally, a ring of low stress high adhesion epoxy 103 may be applied around the die edge, sealing and adding structural strength to the package.

The top surface of solderable contact 40 is coplanar with drain clip projection surfaces 105. Thus, all of contacts 105, 40 and 37 will align with contact traces on a printed circuit board. The drain contacts may take any suitable form and could comprise a single contact or side, if desired.

Figure 22:
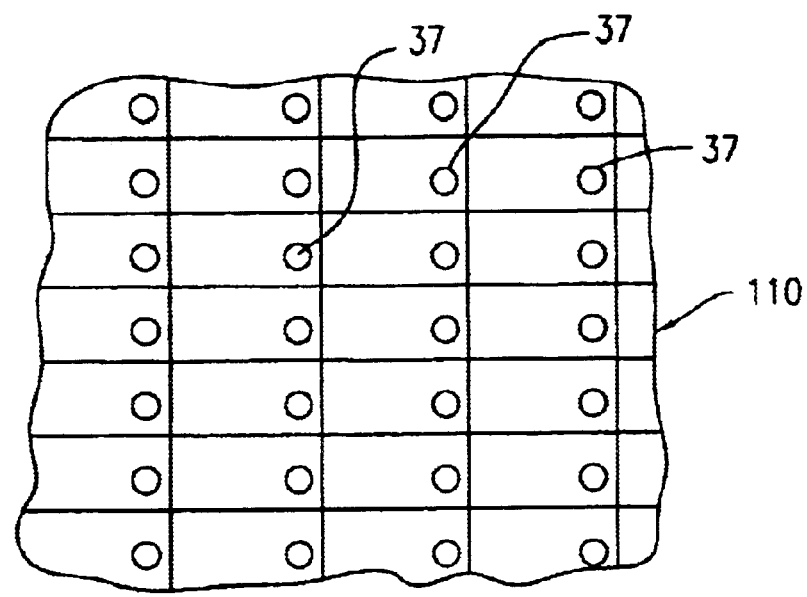
FIG. 22 shows a wafer of MOSFET die before singulation.
Figure 23:
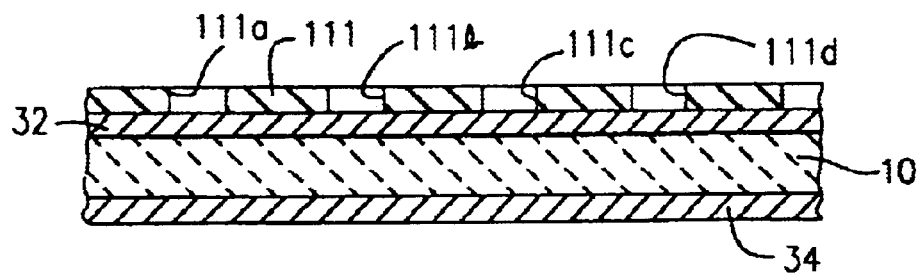
FIG. 23 shows process steps for the formation and patterning of a passivation layer on the source surface of the wafer of FIG. 22.
Figure 24:
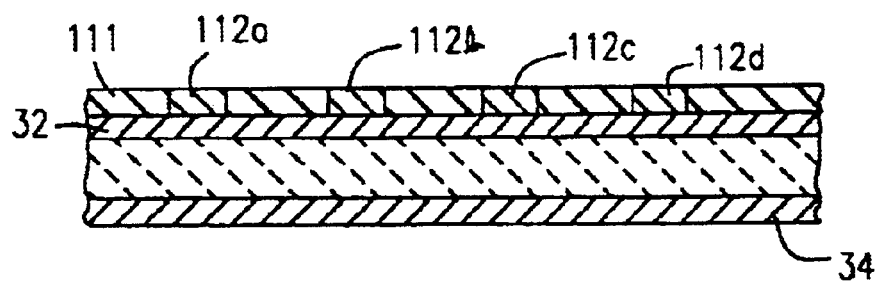
FIG. 24 shows the metalizing atop the passivation layer of FIG. 23.

FIGS. 22 to 24 show a process for forming conductive posts on the aluminum electrodes of a conventional die. Thus, a plurality of identical die, each having a gate electrode 37 and separate source electrodes (not numbered) are shown within wafer 110 prior to die singulation. While still in wafer form, the top surface of the wafer 110 is coated with a photoimagable solder mask 111. Mask 111 is a photosensitive liquid epoxy which will act as a passivation layer, a plating resist (if required) and a solder mask designating and shaping the solder areas. However, other mask materials, for example, silicon nitride, can be used. Using a conventional reticule, multiple openings 111a to 111d are formed through the mask to the underlying source and gate contacts on the die top metal. A laser etch process can also be used to form these openings.

As shown in FIG. 24, a series of metals 112 are then plated atop the surface of the wafer and the plating adheres to the metal of source 32 (and other electrodes) which are exposed through openings 111a to 111d, forming contacts 112a to 112d with the source and a similar contact to the gate. Metals 112a to 112d can consist of a first layer of nickel which makes good contact to the aluminum, followed by a gold flash. Alternatively, the nickel can be followed by layers of copper or tin, and the like, ending with an easily solderable metal top surface such a silver.

The wafer is then sawn to separate the die at lines 112 and 113 for example, and the die are singulated. The typical die 30 has the appearance shown in FIGS. 3 to 8 and has a plurality of solderable source contacts and gate contacts which project above insulation surface 38.

The singulated die are then placed drain source-side down, into conductive clips which are plated on their interior with silver or some other conductive coating. The die is bonded to the clip, using conventional bond material such as a conductive epoxy as previously described. The clips/cans can be presented in the form of a lead frame and the devices can be later singulated from the lead frame.

Figure 25:
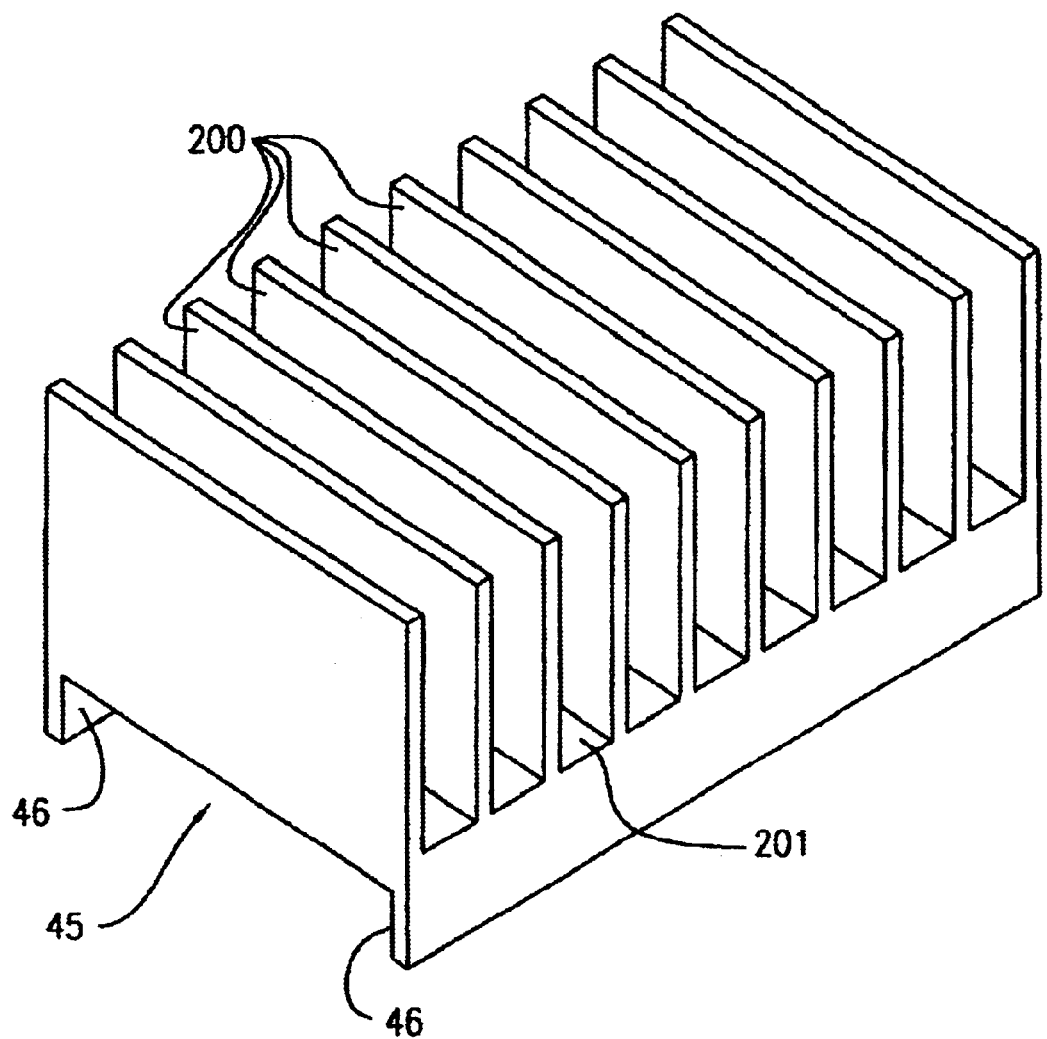
FIG. 25 is an isometric view of the novel drain clip according to the invention.
Figure 27:
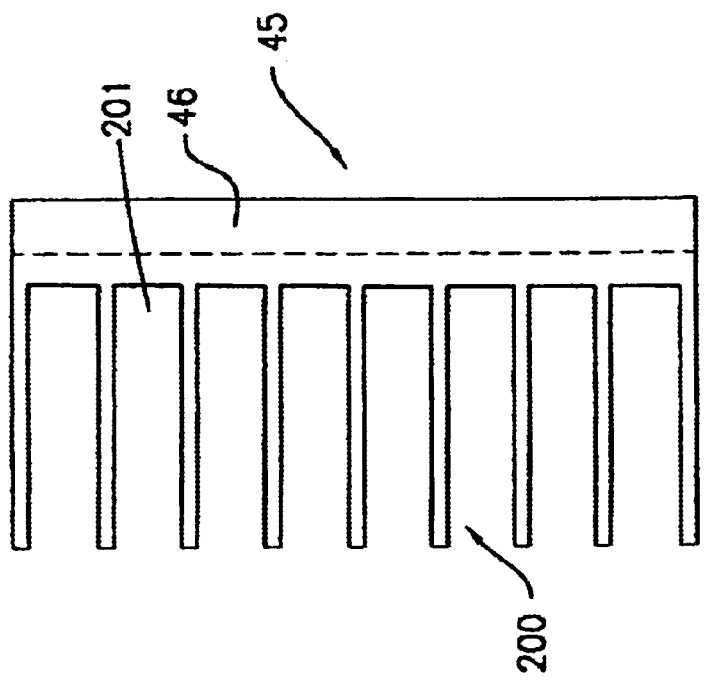
FIG. 27 is a side plan view of FIG. 26.
Figure 26:
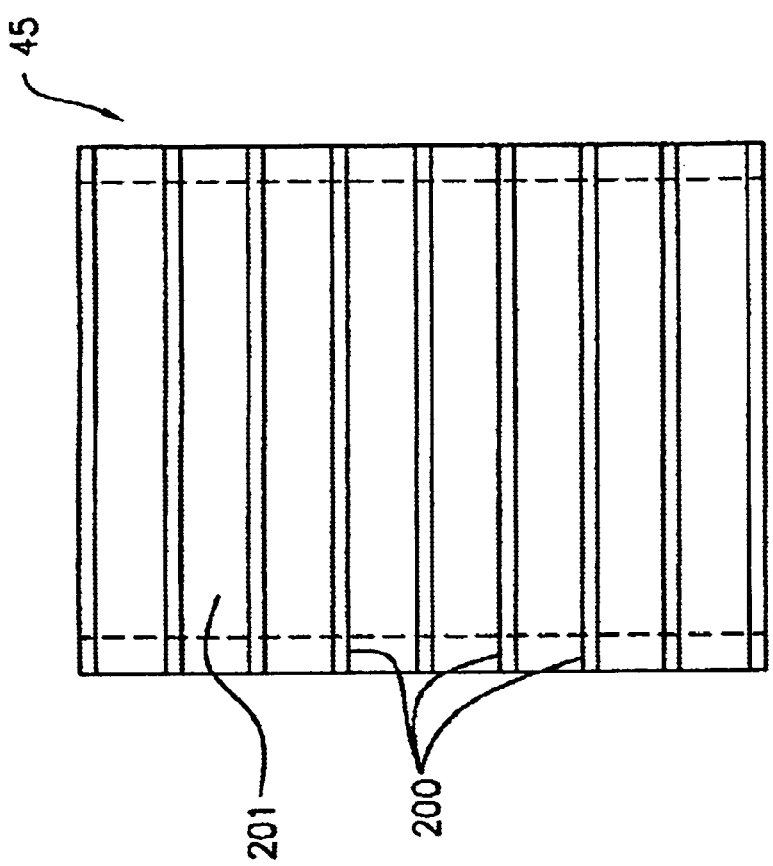
FIG. 26 is a top plan view of the clip of FIG. 25.

According to the present invention, the clip 45 (or 80 or 100) can be modified to improve the dissipation of heat that is generated by the die 30. Referring to FIGS. 25–27, a modified clip 45, for example, would include a web portion 201 having a free surface from which a plurality of cooling fins 200 extend away. According to an aspect of the present invention, web portion 201 can have an increased thickness for better heat extraction and spreading. In the embodiment shown by FIGS. 25–27, the clip 45 includes two posts 46 disposed at opposing edges of web portion 201 and extending away from the surface of web portion 201 which is electrically connected to an electrode of die 30, as will be explained later. The plurality of cooling fins 200, the two posts 46 and the web portion 201 are integrally connected to one another and form a unitary body, which may be made of aluminum, a metal matrix polymer, copper, a copper alloy or some other suitable thermally conductive material through extrusion, molding or some other suitable method. Of course, it should be recognized that a clip according to the present invention is not necessarily limited to the configuration shown by FIGS. 25–27 and may, for example, include fewer or more posts disposed at other positions.

Figure 28:
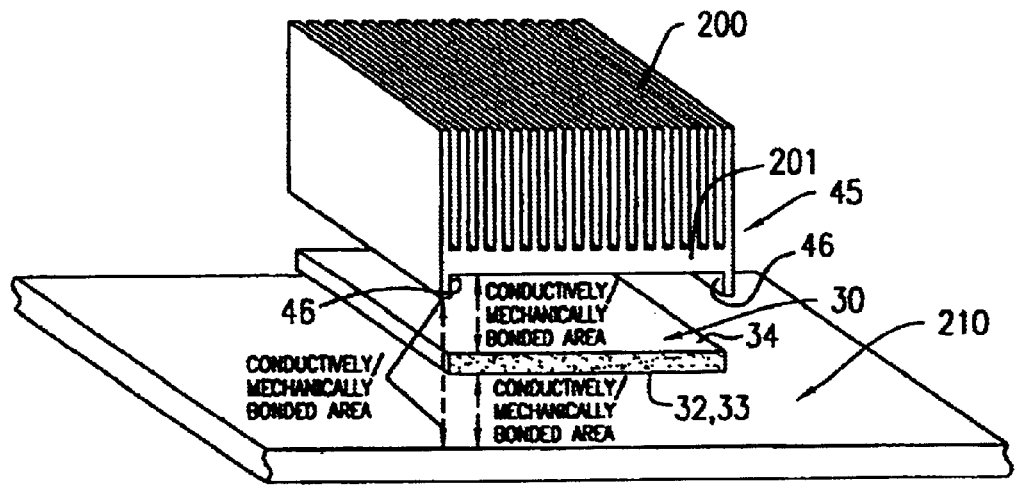
FIG. 28 is an exploded perspective view of the modified drain clip of the invention as applied to a die and a support board.
Figure 29:
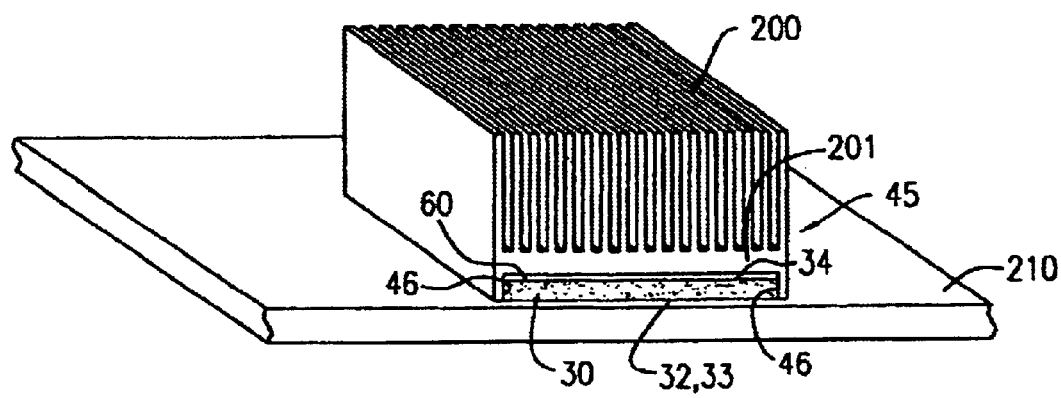
FIG. 29 shows the structure of FIG. 25 after assembly.
Figure 31:
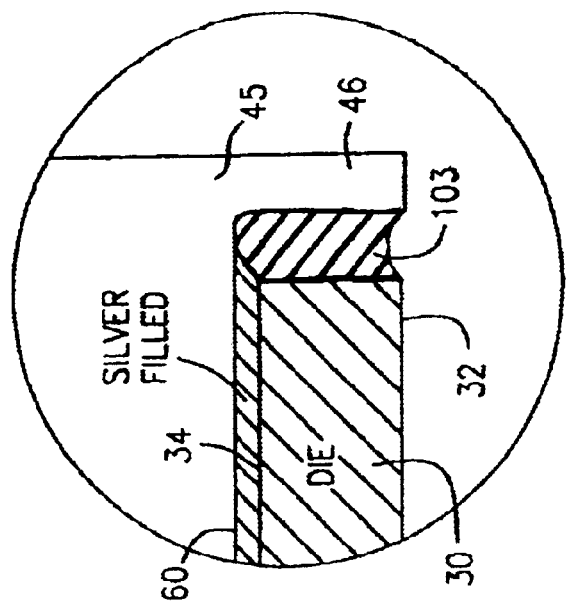
FIG. 31 is an enlarged view of a portion of the device shown by FIG. 30.
Figure 30:
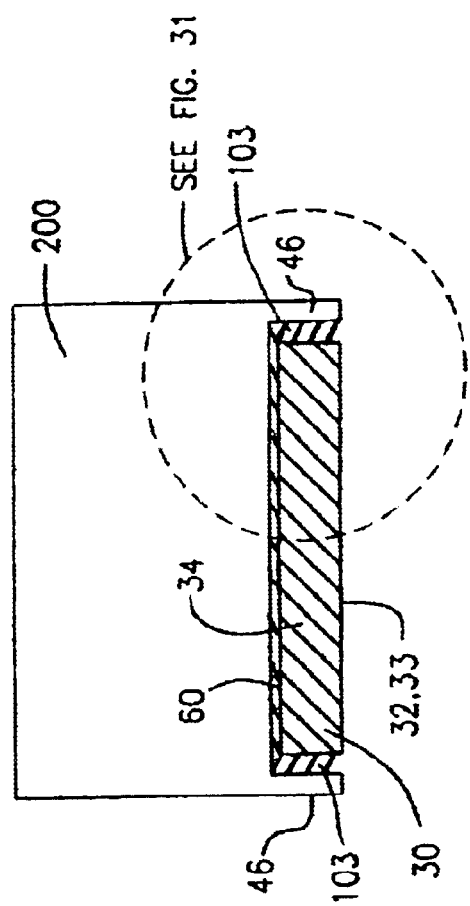
FIG. 30 is a front plan view of FIG. 29.

Referring now to FIGS. 28–29, the back drain 34 of die 30 is conductively attached to the clip 45 by solder or by a conductive silver filled epoxy. Thus, the structure can be attached to a PCB or other mounting board 210 which will have suitable traces (not shown) to receive the source and gate electrodes 32, 33, while the posts 46 may also be connected to drain contact patterns on board 210. Referring specifically to FIGS. 30 and 31, the posts 46 are insulated from the edges of die 30 by an insulation filler 103.

The gate and source 32, 33 and drain 46 are separated within the die/board 210 bondline using a passivation process, similar to that used in the previously described manufacturing process.

Figure 32A:
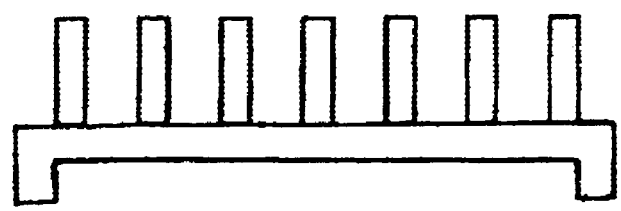
FIGS. 32a and 32b show side and top views of a clip according to an alternative embodiment.
Figure 32B:
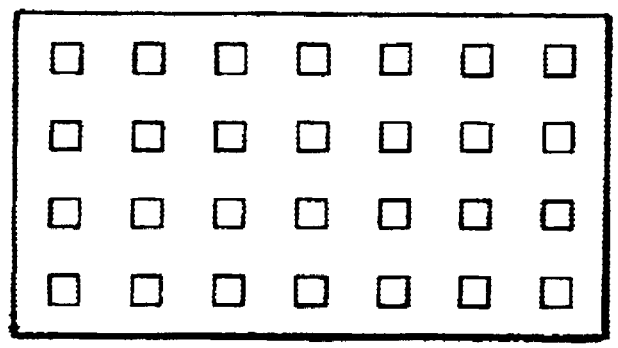

A device according to the present invention is not restricted to clips having fins for dissipating the generated heat; other heat dissipating structures may be utilized. For example, as shown by FIGS. 32a and 32b, according to another embodiment of the present invention, a clip having an array of heat dissipating pins may be used to improve air flow. Each pin in such a clip is a mesa type structure which is able to dissipate heat, but not restrict the flow of air across the heat emitting surface.

In order to improve the solderability of the clips to contacts on a circuit board, the clips may be coated with a material that can be easily soldered such as, for example, nickel, nickel-gold, nickel-palladium or silver. In addition, the clips according to the present invention may be coated with a highly emissive coating to improve heat dissipation by radiation.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
    a semiconductor die having a first electrode disposed on a first major surface thereof and a second electrode disposed on a second major surface thereof;
    an electrically conductive web portion having a first major surface electrically connected to said first electrode;
    a plurality of heat conductive structures extending away from a second major surface of said web portion, said second major surface of said web portion being opposite to its first major surface; and
    at least one conductive post extending from an edge of said web portion in a direction away from said first major surface of said web portion wherein said second electrode of said semiconductor die is adapted to be directly connected electrically and mechanically to a conductive pad and said conductive post includes a connection surface for electrical and mechanical connection to another conductive pad so that said package may become externally connectable to a substrate having said conductive pads with a conductive adhesive without the necessity for an auxiliary element for external connection.

2. A semiconductor device according to claim 1, wherein said electrically conductive web portion is electrically connected to said first electrode by a layer of conductive adhesive.

3. A semiconductor device according to claim 2, wherein said conductive adhesive comprises of solder.

4. A semiconductor device according to claim 2, wherein said conductive adhesive comprises of conductive epoxy.

5. A semiconductor device according to claim 1, wherein said plurality of heat conductive structures and said at least one conductive post are integral with said electrically conductive web portion thereby forming a unitary body.

6. A semiconductor device according to claim 5, wherein said unitary body comprises a thermally conductive material.

7. A semiconductor device according to claim 5, wherein said unitary body comprises one of aluminum and a metal matrix polymer.

8. A semiconductor device according to claim 1, further comprising at least another conductive post extending from another edge of said web portion in a direction away from said first major surface of said web portion.

9. A semiconductor device according to claim 1, wherein said semiconductor die is a power switching device.

10. A semiconductor device according to claim 9, wherein said power switching device is a MOSFET.

11. A semiconductor device according to claim 10, wherein said drain electrode of said MOSFET is electrically connected to said web portion.

12. A semiconductor device according to claim 1, wherein said unitary body comprises one of copper and copper alloy.

13. A semiconductor device according to claim 1, wherein each of said heat conductive structures is one of a fin and a pin.

14. A semiconductor device comprising:
    a semiconductor die having a first electrode disposed on a first major surface thereof and a second electrode disposed on a second major surface thereof;
    an electrically conductive web portion having a first major surface electrically connected to said first electrode;
    a plurality of heat conductive structures extending away from a second major surface of said web portion, said second major surface of said web portion being opposite to its first major at least one conductive post extending from an edge of said web portion in a direction away from said first major surface of said web portion; and
    an insulation filler disposed between said die and said at least one conductive post.

15. A semiconductor device comprising:
    a semiconductor die having a first electrode disposed on a first major surface thereof and a second electrode disposed on a second major surface thereof;
    an electrically conductive web portion having a first major surface electrically connected to said first electrode;
    a plurality of heat conductive structures extending away from a second major surface of said web portion, said second major surface of said web portion being opposite to its first major surface;
    at least one conductive post extending from an edge of said web portion in a direction away from said first major surface of said web portion; and
    a third electrode disposed on said second major surface of said die.

16. A semiconductor device comprising:
    a semiconductor die having a first electrode disposed on a first major surface thereof and a second electrode disposed on a second major surface thereof;
    an electrically conductive web portion having a first major surface electrically connected to said first electrode;
    a plurality of heat conductive structures extending away from a second major surface of said web portion, said second major surface of said web portion being opposite to its first major surface;
    at least one conductive post extending from an edge of said web portion in a direction away from said first major surface of said web portion; and
    a third electrode disposed on said second major surface of said die;
    a passivation layer disposed over at least portions of said second electrode and said third electrode of said semiconductor die.

17. A clip comprising:
    an electrically conductive web portion having a first major surface for adhesion and electrical connection to an electrode of a semiconductor die, and a second major surface opposite to said first major surface;
    a plurality of fins connected to and extending away from said second major surface of said electrically conductive web portion; and
    at least one conductive post connected to an edge of said electrically conductive web portion and extending away from said first major surface;

wherein said unitary body is comprised of a metal matrix polymer.

18. A clip according to claim 17, wherein said plurality of fins and said at least one conductive post are integrally connected to said electrically conductive web portion thereby forming a unitary body.

19. A clip according to claim 17, further comprising at least another conductive post connected to another edge of said electrically conductive web portion and extending away from said first major surface of said web portion.

* * * * *